US010796751B1

(12) United States Patent
Nguyen et al.

(10) Patent No.: US 10,796,751 B1
(45) Date of Patent: Oct. 6, 2020

(54) STATE CHANGE DETECTION FOR TWO-TERMINAL MEMORY

(71) Applicant: Crossbar, Inc., Santa Clara, CA (US)

(72) Inventors: Sang Nguyen, Union City, CA (US); Hagop Nazarian, San Jose, CA (US); Tianhong Yan, Saratoga, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 16/261,696

(22) Filed: Jan. 30, 2019

Related U.S. Application Data

(60) Division of application No. 15/590,245, filed on May 9, 2017, now Pat. No. 10,199,093, which is a continuation-in-part of application No. 14/983,649, filed on Dec. 30, 2015, now Pat. No. 9,659,642.

(60) Provisional application No. 62/334,729, filed on May 11, 2016.

(51) Int. Cl.
| | |
|---|---|
| *G11C 11/419* | (2006.01) |
| *G11C 8/18* | (2006.01) |
| *G11C 7/10* | (2006.01) |
| *G11C 11/418* | (2006.01) |
| *G11C 7/06* | (2006.01) |
| *G11C 13/00* | (2006.01) |

(52) U.S. Cl.
CPC ............ *G11C 11/419* (2013.01); *G11C 7/062* (2013.01); *G11C 7/1015* (2013.01); *G11C 8/18* (2013.01); *G11C 11/418* (2013.01); *G11C 13/0002* (2013.01); *G11C 2211/5645* (2013.01)

(58) Field of Classification Search
CPC ....... G11C 11/419; G11C 11/418; G11C 8/18; G11C 7/1015; G11C 7/062; G11C 2211/5645; G11C 13/0002
See application file for complete search history.

(56) References Cited

U.S. PATENT DOCUMENTS

| | | | |
|---|---|---|---|
| 8,416,605 B2* | 4/2013 | Kono | G11C 13/0002 365/148 |
| 2003/0058686 A1 | 3/2003 | Oolshi et al. | |
| 2006/0067120 A1 | 3/2006 | Drebinger | |
| 2006/0092691 A1 | 5/2006 | Shiimoto et al. | |
| 2011/0157958 A1 | 6/2011 | Sasaki | |
| 2011/0228586 A1 | 9/2011 | Kawabata et al. | |
| 2012/0033480 A1 | 2/2012 | Hosono et al. | |

(Continued)

OTHER PUBLICATIONS

Office Action for U.S. Appl. No. 14/983,649 dated Jul. 27, 2016, 30 pages.

(Continued)

*Primary Examiner* — Sultana Begum
(74) *Attorney, Agent, or Firm* — Wegman Hessler

(57) ABSTRACT

A detection circuit that can detect a two-terminal memory cell changing state. For example, in response to electrical stimuli, a memory cell will change state, e.g., to a defined higher resistance state or a defined lower resistance state. Other, techniques do not detect this state change until after the stimuli is completed and a subsequent sensing operation (e.g., read pulse) is performed. The detection circuit can detect the state change during application of the electrical stimuli that cause the state change and can do so by comparing the magnitudes or values of two particular current parameters.

20 Claims, 10 Drawing Sheets

(56) References Cited

U.S. PATENT DOCUMENTS

2015/0208008 A1   7/2015  Gendai
2017/0146612 A1*  5/2017  Chen ..................... G01R 31/40

OTHER PUBLICATIONS

Office Action for U.S. Appl. No. 15/590,245 dated Feb. 21, 2018, 25 pages.

* cited by examiner

STATE CHANGE DETECTION FOR TWO-TERMINAL MEMORY

CROSS REFERENCE TO RELATED APPLICATIONS

The present application is a Divisional U.S. application Ser. No. 15/590,245 filed May 9, 2017, which claims the benefit of U.S. provisional application Ser. No. 62/334,729 filed May 11, 2016, and is a Continuation-in-Part of U.S. patent application Ser. No. 14/983,649 (now U.S. Pat. No. 9,659,642), filed Dec. 30, 2015. The foregoing applications are hereby incorporated by reference herein in their respective entireties and for all purposes.

TECHNICAL FIELD

This disclosure generally relates to techniques for detecting a state change of a two-terminal memory cell, and more specifically to detecting state changes (e.g., that the cell has been erased) in response to an electrical stimuli while the stimuli is being applied.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for a detection circuit that can detect a state change of a two-terminal memory cell (TTMC) or two-terminal memory device. In some embodiments, the detection circuit can comprise a reference current source that in operation can supply a reference detection current, $I_{rd}$, a comparison line, and a first current mirror circuit comprising a first transistor (M1) and a second transistor (M2) and a second current mirror circuit comprising a third transistor (M3) and a fourth transistor (M4). The first current mirror circuit can further comprise: a first gate line that is coupled to gates of M1 and M2; a drain supply line that applies a drain supply voltage, Vdd, to drains of M1 and M2 and to the reference current source; a first source line coupled to a source of M1; a second source line coupled to a source of M2, to the comparison line and to a third source line coupled to a source of M3. The second current mirror circuit can further comprise: M3 and M4 having drains coupled to ground; a second gate line coupled to gates of M3 and M4; the third source line coupled to the comparison line and the second source line; and a fourth source line coupled to a source of M4 and to the reference current source. In operation, a detection current, $I_d$, mirrored from M1 to M2 can be effectively compared to $I_{rd}$ that is mirrored from M4 to M3 in order to detect a state change of the TTMC.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
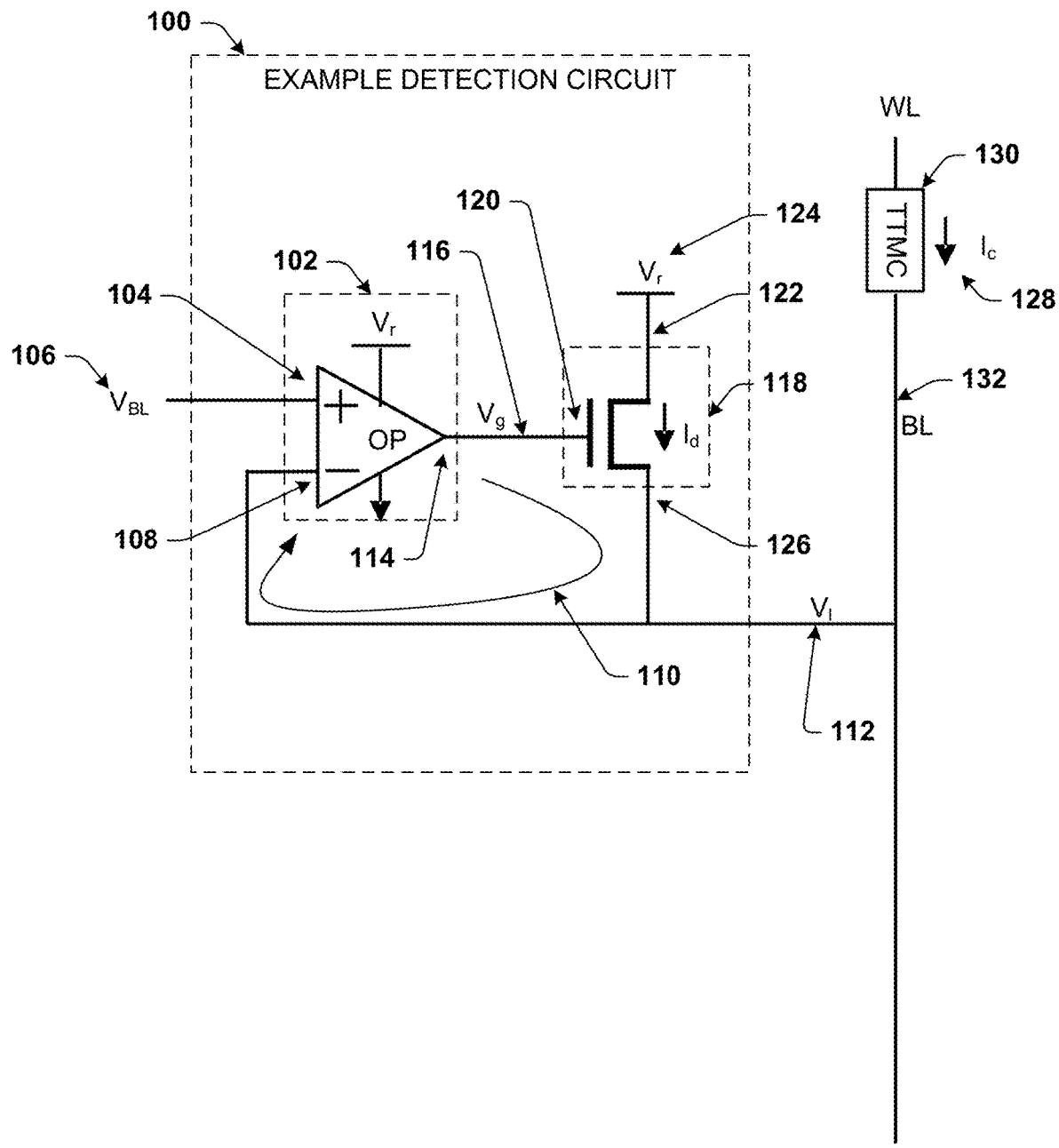
FIG. 1 illustrates a block diagram of an example detection circuit representing a first detection circuit embodiment that can detect a state change of a two-terminal memory device in accordance with certain embodiments of this disclosure.

As used herein by convention, an "erased" memory cell is one that is in a highest resistive state (e.g., an off-state), which is contrasted with a lowest resistive state (e.g., an on-state). For single-level cell (SLC) memory in which a single cell represents one bit of information, the highest resistive state and the lowest resistive state can be logically mapped to binary values such as, e.g., "1" and "0". For multi-level cell (MLC) memory in which a single memory cell can represent multiple bits of information, and in this example four-bit MLC, the highest resistive state and the lowest resistive state can be logically mapped to binary values such as, e.g., "1111" and "0000" with the intervening binary values representing other measurably distinct states of the memory cell. It is understood that conventions used herein associated with the state of the cell or associated logical binary mapping are not intended to be limiting, as other conventions, including an opposite convention can be employed in connection with the disclosed subject matter. To simplify explanation, techniques detailed herein are described and illustrated in connection with SLC memory, but it is understood that the disclosed techniques can also be utilized for MLC memory. The disclosed techniques are also generally illustrated in connection with an erase operation, although in some implementations, the disclosed techniques can apply as well to other operations such as program operations.

Conventional memory devices typically have a large number of individual memory cells coupled to a shared wordline. In embodiments in which the memory cells are individually addressable, each memory cell is coupled to a bitline that is not shared by any other cell on the wordline. To perform some state-changing operation (e.g., program, erase, etc.) on all or some subset of these memory cells, an electrical stimulus (e.g., a program pulse or erase pulse, etc.) is asserted on the shared wordline. Generally, this electrical stimulus affects only those memory cells on the wordline for which the associated bitline is appropriately configured or selected. Hence, application of a suitable stimulus to the wordline in combination with another suitable stimulus applied to one or more bitlines (e.g., a voltage bias or ground) can change the state of any or all of the memory cells on that wordline. For example, an erase stimulus (e.g., a suitable erase voltage bias) applied to the wordline can cause each memory cell with an appropriately configured and/or selected bitline to be "erased," while not affecting other memory cells (e.g., those connected to unselected bitlines).

Generally, stimuli to be applied to the wordline and bitlines are calculated in advance to match the specification of the memory cells. If every memory cell attached to a wordline is structurally identical, then a given stimulus applied uniformly to the wordline will uniformly affect all selected cells. However, due to manufacturing defects, wear and tear, and numerous other factors, memory cells in the real world do not respond identically to the same stimuli. For example, a cell that is perfectly fabricated according to specification may be known to transition from the on-state to the off-state in response to a standard erase pulse that biases the wordline with a precise voltage magnitude applied for a precise duration. Yet, a second memory cell on the wordline may require a higher voltage magnitude or longer duration than the standard erase pulse in order to complete the erase operation. A third memory cell on the wordline may become erased in response to a smaller voltage magnitude and/or shorter duration than the standard erase pulse and therefore is more likely to be damaged by the standard erase pulse.

Thus, consider a conventional operation that is intended to erase all the memory cells on a particular wordline. Since a single wordline may serve thousands of memory cells, all with slight thresholds differences, the specified stimuli applied to the wordline and bitlines will likely successfully erase only a small subset of the memory cells. In order to address this issue, conventional solutions had to overcome two distinct challenges. First, provide a way to erase those memory cells that did not successfully change state in response to the stimuli and, second, identify which cells did not change state.

Because two-terminal memory only has two terminals, other systems have not been able to detect electrical characteristic changes that indicate a successful state change of the memory cell while the stimuli to effect the state change are asserted. In other words, while the erase pulse was being applied, there was no known way to determine if the memory cell was successfully erased.

Hence, conventional solutions implement what is known as incremental step pulse (ISP) operations. In accordance with ISP, after completion of the initial stimuli applied to a particular memory cell that is intended to change the state of the cell, a read pulse is subsequently applied to determine if the cell did in fact change to the intended state. If the subsequent read operation indicates that the previous operation failed to set the cell to the intended state, then the program/erase pulse is repeated, albeit generally with a higher pulse (e.g., voltage) magnitude, for a longer duration, or both. In other words, if an erase pulse with a voltage magnitude, v, asserted for time, t, fails to set the memory cell to the off-state, then another erase pulse with a voltage magnitude, v+x, is asserted for time, t+y, where x and y can be ≥0. In some cases, many such cycles are needed before the cell is updated to the desired state.

ISP and other similar solutions do have drawbacks. For example, a subsequent read pulse is necessary to determine the current state of a memory cell upon completion of the erase pulse. Furthermore, on average, numerous erase cycles are required to perform an erase operation on a given memory cell. Both the read pulse and the multiple erase cycles increase power consumption and cycle timing tolerances or expectations associated with operation. Moreover, even if the cell changes state near the beginning of a given erase pulse, the full pulse is still asserted on the cell. Such leads to unnecessary power consumption and can damage the memory cell.

The subject matter disclosed herein relates to a detection circuit that can detect a state change of a two-terminal memory cell such as detecting that the memory cell has transitioned from a low-resistive state to a high-resistive state or vice versa. Put differently, the detection circuit can detect that a memory cell has changed state (e.g., has been programmed or erased) in response to stimuli. Advantageously, the detection circuit can detect memory state changes during application of the program/erase pulse rather than subsequent to the pulse. In that regard, many of the drawbacks associated with ISP or other conventional solutions can be mitigated. For example, the program/erase pulse can be immediately inhibited or terminated in response to the state change being detected, which can reduce power consumption, prevent potential damage to the cell, and can significantly improve sensing margin since program/erase pulse can be shut off as soon as a memory cell transitions to a desired state. As another example, the program/erase pulse can be configured in a simplified manner, with fewer constraints and without the expectation that the program/erase pulse will be unsuccessful for some cells. As still another example, only a single pulse or fewer pulses will generally be needed to successfully change the state of a given memory cell or many memory cells on the same wordline, regardless of the structural differences these memory cells may exhibit. In some embodiments, the detection circuit can include various reference circuits that can facilitate wide flexibility with respect to compatibility with a wide range of different memory architectures. In other words, the disclosed subject matter can be useful for many different two-terminal memory technologies or architectures and can even be configured, potentially in situ, to increase performance, endurance or other suitable characteristics.

In more detail, the inventors have disclosed various embodiments in which a change to a gate voltage (e.g., $V_g$) in a detection circuit can be employed to detect a state change for a two-terminal memory cell. Further detail regarding these embodiments can be found with reference to FIGS. 1-4 of the present application and U.S. patent application Ser. No. 14/983,649, entitled STATE CHANGE DETECTION FOR TWO-TERMINAL MEMORY DURING APPLICATION OF A STATE-CHANGING STIMULUS and filed Dec. 30, 2015, which is assigned to the assignee of the present application for patent and is incorporated by reference herein in the entirety and for all purposes.

In the present application, and specifically FIGS. 5-8, example embodiments of one or more detection circuits are provided that can detect a state change of a two-terminal memory cell based on a comparison of specific current parameters. In this regard, while FIGS. 1-4 generally relate to comparing voltages to detect a state change, FIGS. 5-8 generally relate to comparing currents to detect the state change.

The inventors believe that current-based detection circuits (e.g., as opposed to voltage-based detection circuits) may provide additional advantages. For example, detection of a state change need not rely upon a voltage comparator (e.g., element 304 of FIG. 3) or be subject to the precision or limitations of such a device or the cost for such a device should one be used.

Example Voltage Comparison Detection Circuit Embodiments

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example detection circuit 100 is depicted. Detection circuit 100 is intended to represent a first detection circuit embodiment that can detect a state change of a two-terminal memory device. Various other embodiments of the disclosed detection circuit are provided herein, such as detection circuit 202 illustrated at FIG. 2, and detection circuit 402 illustrated at FIG. 4. Regardless of the particular implementation, the detection circuits disclosed herein (e.g., 100, 202, 402) can be coupled to a bitline or a wordline of a two-terminal memory cell (TTMC) and can detect a state change of the TTMC. For example, conventional memory devices update the information stored in memory via memory operations (e.g., program or erase operations) that change the state of the memory cells. Hence, a memory cell is "programmed" or "erased" by applying a suitable electrical stimuli to the cell (e.g., via a wordline and/or bitline) intended to set or change the state of the memory cell.

In a first embodiment, detection circuit 100 can comprise a first element 102 and a second element 118. In some embodiments, first element 102 can be an operational amplifier device. In some embodiments, second element 118 can be a transistor. First element 102 can comprise a first input 104 coupled to a source 106, herein denoted as $V_{BL}$. Source 106 (e.g., $V_{BL}$) can be activated to bias the bitline (e.g., bitline 132) of a TTMC (e.g., TTMC 130). Said differently, when TTMC 130 is to be set to an erased state (e.g., a highest resistance state), such is typically done by applying an erase pulse to TTMC 130. This erase pulse, e.g., can bias an associated wordline and an associated bitline. The bias applied to the wordline and the bias applied to the bitline can include floating or grounding and are referred to herein collectively as "pulse," "program pulse," "erase pulse," "program/erase pulse," "stimuli," "electrical stimuli," or the like. It is understood that all such references can have two portions, e.g., the stimulus portion that is applied to the worldine (e.g., 2.0 V) and the stimulus portion applied to the bitline (e.g., 0.5 V). Hence, whatever stimulus is applied to TTMC 130 that is intended to change the state of TTMC 130 can be fed into first input 104 of first element 102.

First element 102 can also comprise second input 108. Second input 108 can be coupled to a feedback loop 110 that is coupled to bitline 132 via a local line 112. Voltage characteristics associated with local line 112 are denoted herein as $V_1$. In some embodiments, detection circuit 100 can regulate $V_1$ to be equal to or substantially equal to $V_{BL}$.

First element 102 can further comprise first output 114. First output 114 can be coupled to a third input 120 of the second element 118 via a gate line 116. Voltage characteristics associated with gate line 116 and/or first output 114 are denoted herein as $V_g$. As illustrated, gate line 116 can represent a portion of feedback loop 110.

Second element 118 can comprise third input 120 (e.g., that is coupled to first output 114 of first element 102 via gate line 116) and fourth input 122 that is coupled to reference source 124. Reference source 124 can provide a reference voltage, $V_r$ (e.g., 3.3 V), which can be fixed or variable for the remainder of this disclosure. Second element 118 can further comprise second output 126 that can be coupled to another portion of feedback loop, as illustrated.

As will be further detailed herein a current through second element 118, referred to herein as "detection current" and denoted $I_d$, can change in response to changes of a current through TTMC 130, referred to herein as "cell current" (e.g., cell current 128) and denoted $I_c$. $I_c$ will exist in response to the electrical stimuli (e.g., an erase pulse) applied to the wordline and/or bitline 132 of TTMC 130. The value or magnitude of $I_c$, however, will vary based on the state of TTMC 130. For example, consider the case in which TTMC 130 is in a lowest resistance state (or not in the highest resistance state), and receives an erase pulse intended to set TTMC 130 to the highest resistance state. Initially, $I_c$ will be high (e.g., 40 μA), since $I_c$ is in a low resistance state. However, upon transitioning to the highest resistance state (e.g., the intent of applying the erase pulse), $I_c$ quickly drops from 40 μA to some lower value, e.g., to 10 μA, 1 μA, or some other suitable value. Since various elements of the detection circuits detailed herein can maintain an inverse relationship between $I_c$ and $I_d$, when $I_c$ drops, $I_d$ increases. Furthermore, since a fixed relationship exists between $I_d$ and $V_g$, as $I_d$ increases (in response to $I_c$ decreasing), $V_g$ must also increase.

In some embodiments, the detection circuits disclosed herein can have the following properties:

$V_1 = V_{BL}$;

$I_d$ is inversely proportional to $I_c$;

$V_g$ is a function of $I_d$ and inversely proportional to $I_c$;

A measure of $V_g$ can indicate TTMC 130 has changed state.

Figure 2:
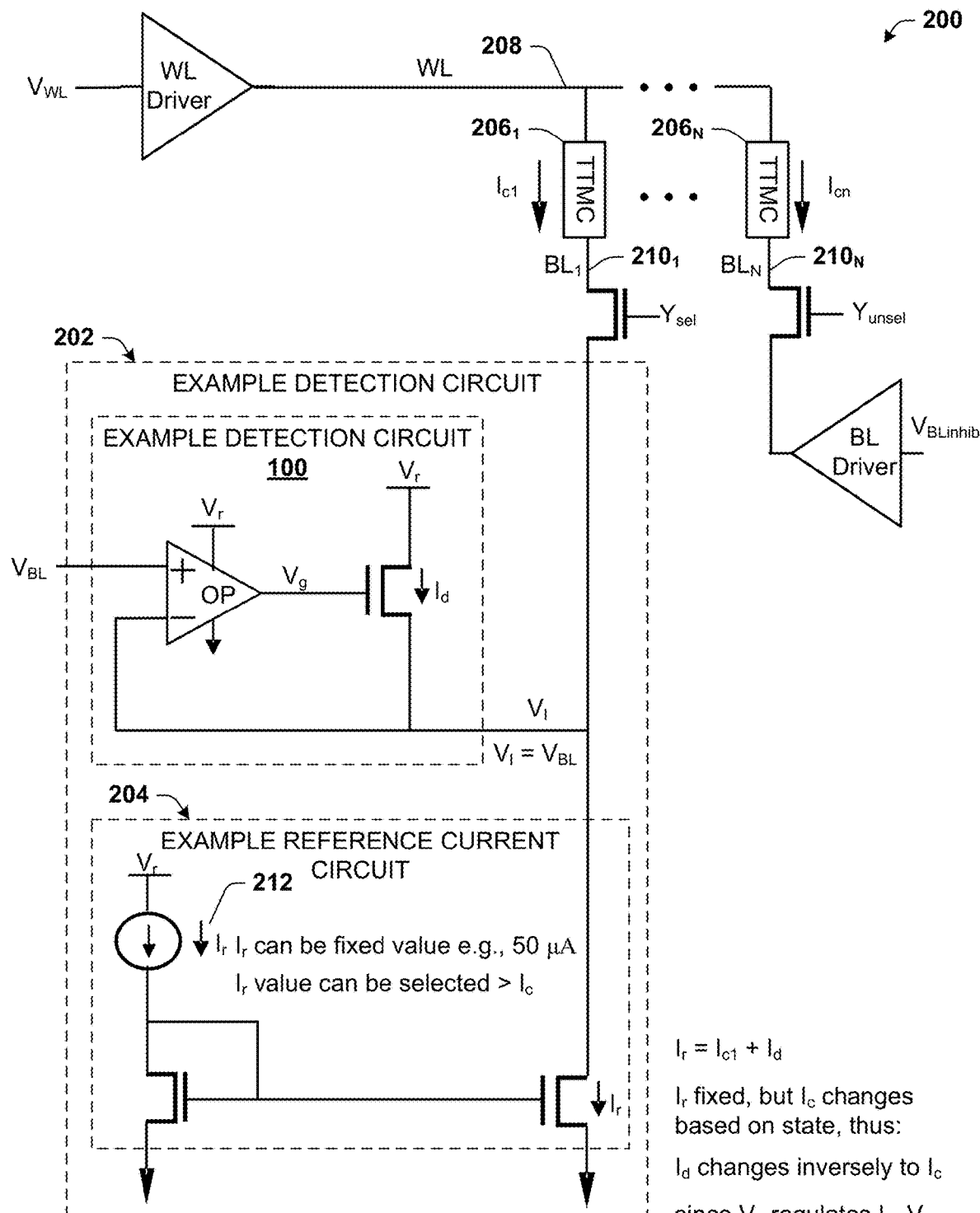
FIG. 2 depicts an example memory device that can provide a reference current used to detect a two-terminal memory changing state in response to an electrical stimulus in accordance with certain embodiments of this disclosure.

Referring now to FIG. 2, example memory device 200 is provided. Memory device 200 can provide a reference current used to detect a two-terminal memory changing state in response to an electrical stimulus. Memory device 200 can include detection circuit 202 that comprises the same or similar elements of detection circuit 100 detailed in connection with FIG. 1. Memory device 200 can further comprise a reference current circuit, an example of which is denoted by reference numeral 204.

As illustrated, memory device 200 comprises a plurality of TTMCs $206_1$-$206_n$, each sharing a common wordline 208, wherein n can be a natural number greater than one. TTMCs $206_1$-$206_n$ are referred to herein, either individually or collectively as TTMC(s) 206, with subscripts generally used only when necessary to distinguish or better impart the disclosed subject matter. Wordline 208 receives an electrical stimulus (e.g., an erase pulse denoted $V_{WL}$) which will vary depending on the implementation and/or the characteristics of the associated TTMCs 206. In some embodiments, this electrical stimulus can be a voltage bias in a range of about 0.5 V to about 3.0 V. A typical example used herein is about 2.0 V. In this example, TTMC $206_1$ is selected (e.g., by $Y_{set}$) while TTMC $206_n$ is not selected (e.g., $Y_{unsel}$). Since TTMC $206_1$ is selected, a bitline $210_1$ associated with TTMC $206_1$ receives an associated electrical stimulus which will also vary depending on the implementation and/or the characteristics of the associated TTMCs 206. In some embodiments, this electrical stimulus can be a voltage bias in a range of about zero volts to about 1.5 V. A typical example used herein is about 0.5 V. The electrical stimulus applied to bitline $210_1$ is again denoted $V_{BL}$.

As illustrated, reference current circuit 204 provides a fixed reference current 212, denoted $I_r$. $I_r$ can be configured based on the specification of TTMCs 206 or based on testing measurements. In some embodiments, $I_r$ can be set to a value that is known or estimated to be greater than the cell current, $I_c$, for any TTMC 206, while in a lowest resistance state. For example, if this cell current (e.g., while in the lowest resistance state) is e.g., 40 μA, then $I_r$ can be set to some value that is higher, such as, e.g., 50 μA.

Since $I_r$ is fixed, detection circuit 202 forces $I_d$ (e.g., detection current through second element 118) to compensate the difference between $I_r$ and $I_c$ (in this case, specifically $I_{c1}$). Hence, in this example, $I_d$ will be about 10 μA. However, at some time after the electrical stimulus is applied to TTMC 206, the cell can change state to the highest resistance state. Upon transitioning to the highest resistance state, $I_c$ is reduced. Suppose $I_c$ reduces from 40 μA to 5 μA. Since $I_r$ is fixed, the drop in $I_c$ from 40 μA to 5 μA forces $I_d$ to increase from 10 μA to 45 μA. Due to the fixed relationship between $V_g$ and $I_d$, $V_g$ sees an concomitant increase as well. By measuring or comparing $V_g$, detection circuits detailed herein can identify precisely when associated TTMCs 206 change state in response to stimuli, which is further detailed with reference to FIG. 3.

Figure 3:
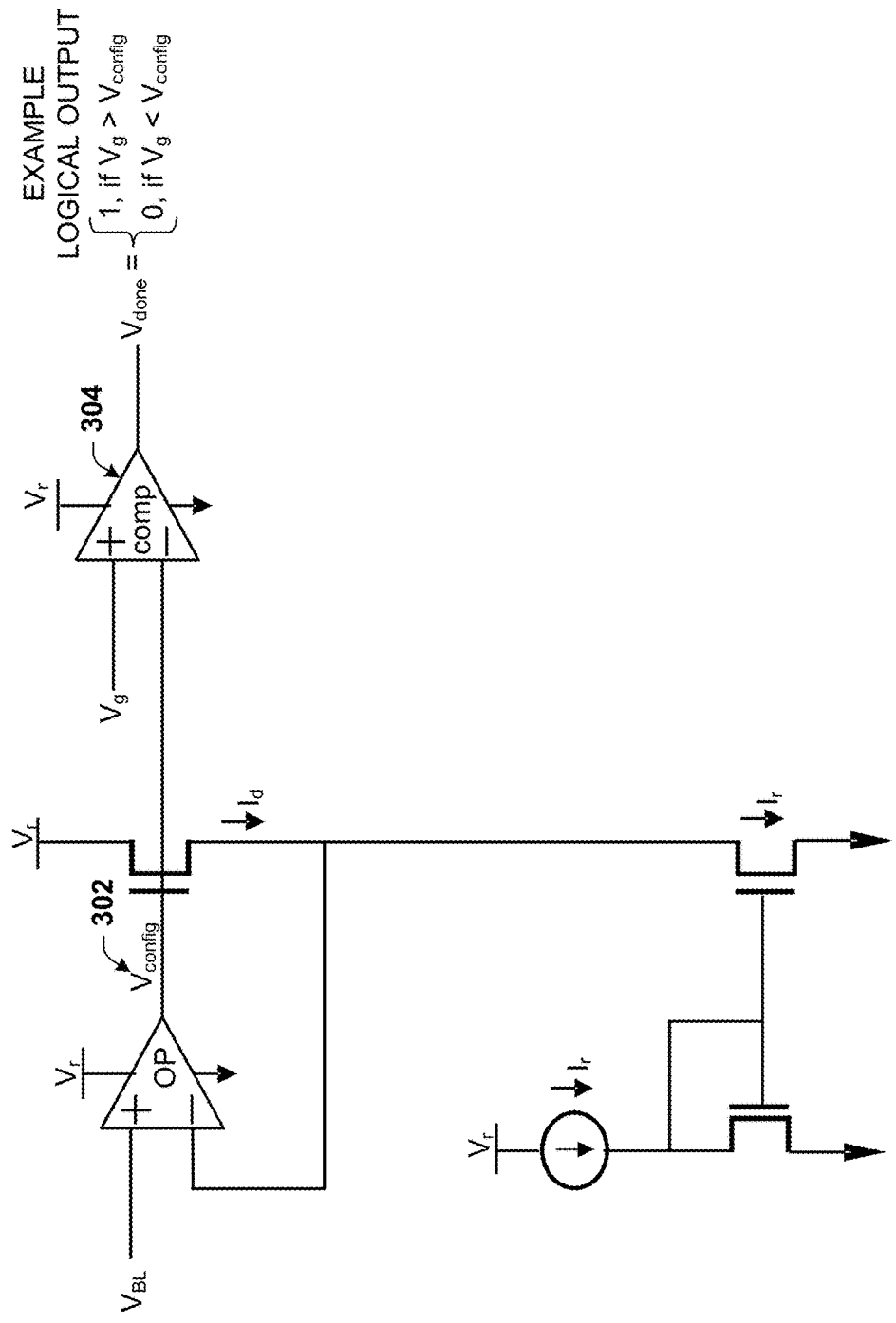
FIG. 3 depicts an example configurable global reference circuit that can provide a configurable state reference voltage in accordance with certain embodiments of this disclosure.

Turning now to FIG. 3, example configurable global reference circuit 300 is provided. Configurable global reference circuit 300 can provide a configurable state reference voltage 302, denoted $V_{config}$. $V_{config}$ can represent, for example a threshold voltage that is indicative of a state associated with TTMC 206. Configurable global reference circuit 300 can comprise a comparator device (e.g., an op-amp comparator) 304 that compares $V_g$ with $V_{config}$. An output of comparator device 304, denoted $V_{done}$, can represent this comparison. For example, $V_{done}$ can be asserted if $V_g$ is greater than $V_{config}$ and not asserted otherwise. In this regard, $V_{done}$ can go high or be asserted in response to a state change associated with TTMC 206 and can thus be utilized to signal other elements to inhibit the electrical stimulus being applied to TTMC 206. In other words, the stimulus applied to TTMC 206 can be inhibited immediately upon the effects of the stimulus being realized (e.g., TTMC 206 being set to the desired state).

Figure 4:
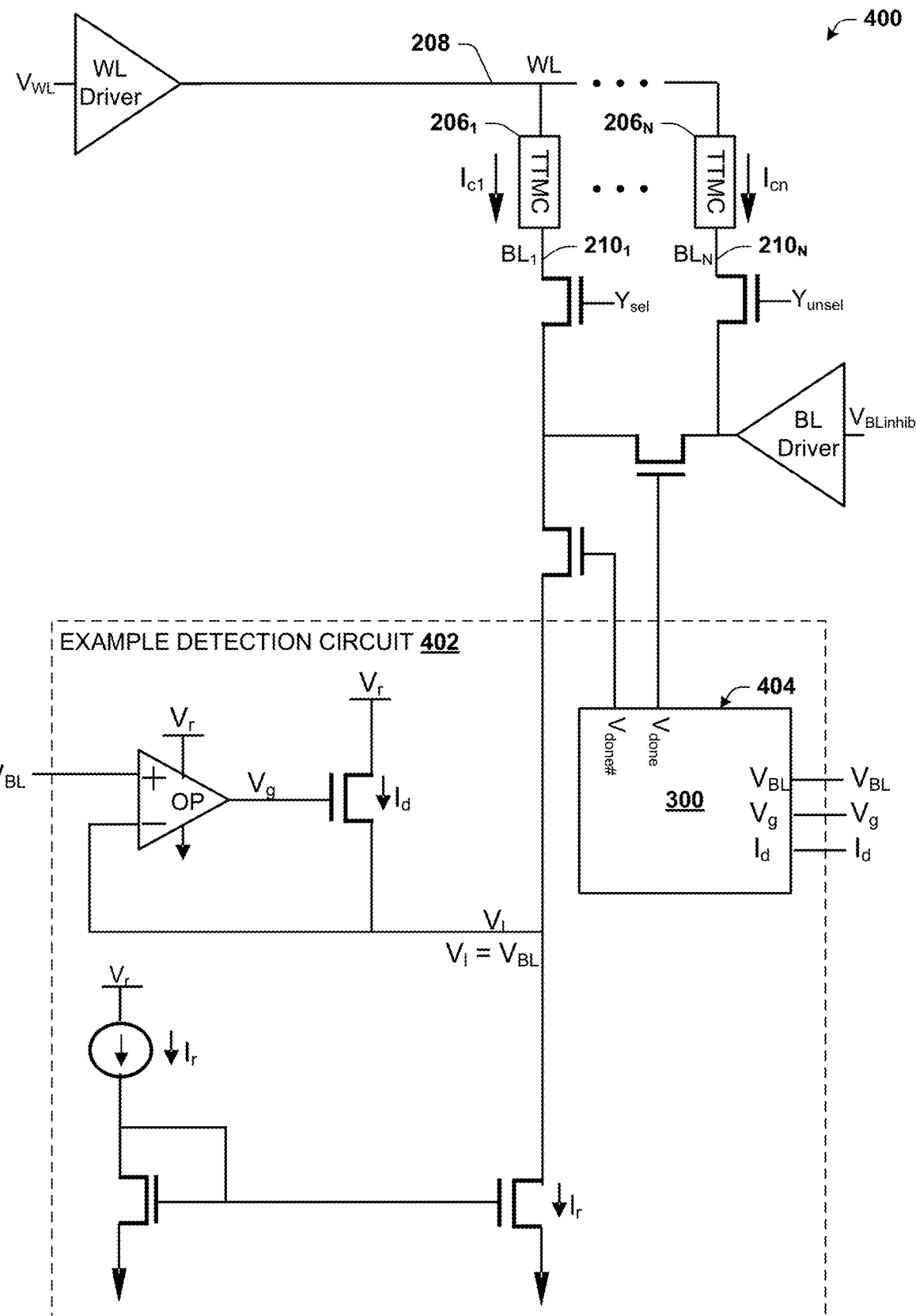
FIG. 4 depicts an example memory device that can inhibit an electrical stimulus applied to a memory cell in response to the memory cell changing state in accordance with certain embodiments of this disclosure.

FIG. 4 provides another example memory device 400 that can inhibit an electrical stimulus applied to a memory cell in response to the memory cell changing state. Memory device 400 can be substantially similar to memory device 200. In this embodiment, memory device 400 can comprise example detection circuit 402, representing yet another example embodiment of the disclosed detection circuit. Detection circuit 402 can comprise all or a portion of detection circuit 202 detailed in connection with FIG. 2. Additionally or alternatively, detection circuit 402 can comprise element 404 that can inhibit the electrical stimulus that changes the state of TTMC 206 in response to detecting TTMC 206 has changed state. Element 404 can comprise all or a portion of configurable global reference circuit 300 detailed in connection with FIG. 3.

In some embodiments, the two-terminal memory detailed herein can include an interface layer situated between a top electrode (TE) and a bottom electrode (BE). In some embodiments, TTMC 206 can be a single-level cell (SLC) characterized by two distinct measurable states. In some embodiments, TTMC 206 can be a multi-level cell (MLC) characterized by different measurable states of the TTMC 206 representing multiple bits of data. In some embodiments, TTMC 206 can be a resistive two-terminal memory cell. In some embodiments, TTMC 206 can be a non-volatile, two-terminal memory cell characterized by maintaining a particular state in the absence or substantial absence of electrical power being supplied to the memory cell.

As noted previously, TTMC 206 can be a resistive-switching memory device such as a resistive random access memory (RRAM) device. TTMC 206 may be a monolithic stack of layers and may be formed on top of an insulating substrate upon which one or more complementary metal-oxide-semiconductor (CMOS) devices have been formed. In some embodiments, the CMOS devices include control transistors/control logic, or other devices (e.g. processor, logic) that may be selectively coupled to terminal(s) of a TTMC 206 device.

The monolithic stack of layers (or another suitable arrangement) of TTMC 206 can include an active region that can be situated between a bottom terminal (e.g., one layer of the monolithic stack) and a top terminal (e.g., another layer of the monolithic stack). The active region can be created comprising a conductive contact layer (e.g. a metal layer, a silicon bearing layer, etc.), an interface layer, and an active metal layer. The interface layer can be composed of or comprise one or more engineered or controlled oxide(s), which is referred to herein as a sub-oxide. The interface layer can comprise a non-stoichiometric sub-oxide that can be a combination or mixture, possibly non-homogenous, of various silicon-based layers or elements with an aggregate chemical formula of $SiO_X$, where $0 \le X < 2$. As another example, the aggregate chemical formula can be $Si_xGe_yO_z$, where $x \ge 0$, $y \ge 0$, $z \ge 0$, $x+y \le z \le 2(x+y)$. In some embodiments, the active metal layer, as a conductive metal, can double as the top terminal, which is coupled to wordline 208. In some embodiments, the conductive contact layer can double as the bottom terminal, which is coupled to bitline 210. In various embodiments, the interface layer includes multiple crystalline defects. Other examples can exist.

The active region can exhibit a plurality of stable or semi-stable resistive states, each resistive state having different electrical characteristics (e.g., resistance, conductance, etc.). Moreover, respective states of the plurality of states can be formed or activated in response to a respective voltage difference applied at the two conductive contacts. Embodiments of the subject disclosure can provide a filamentary-based memory cell. For example, in a 'programmed' or 'on' state, in response to a program voltage applied across the terminals ions are created within active metal layer 210 and are injected or driven from the active metal layer to permeate the interface layer. Once the program voltage is removed, the ions are trapped within the defects of the interface layer and become neutral metal particles. In some embodiments, the trapped metal particles form one or more conductive filament(s).

One example of a filamentary-based device can comprise: one or more conductive layers (e.g., comprising, e.g., TiN, TaN, TiW, metal compounds), an optional interface layer (e.g., doped p-type (or n-type) silicon (Si) bearing layer (e.g., p-type or n-type polysilicon, p-type or n-type polycrystalline SiGe, etc., or a combination of the foregoing)), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tens of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

It should be appreciated that disclosed filamentary-based devices are not limited to the conductive layer(s), RSL and active layer provided above. Additional layers can be included between one or more of the foregoing layers in some embodiments, and where suitable. Examples of such additional layers can include adhesion layers for securing one material to another, blocking layers for mitigating contamination between layers, diffusion barrier layers for mitigating diffusion of an element(s) or compound(s) through the diffusion barrier layer(s), ion layers for providing conducting particles or facilitating electrical conductivity at the ion layer(s); resistive layers for mitigating electrical conductivity at the resistive layer(s) or tunneling layers for controlled electron tunneling through the tunneling layer(s), contact material layers for providing good ohmic contact between two (or more) materials/layers, or other suitable layers known to one of ordinary skill in the art of fabrication of a solid-state memory device, or a suitable combination of the foregoing. In a further embodiment, multiple instances of a layer can be provided (e.g., multiple conductive layers, multiple RSLs, multiple active layers, or multiple other layers).

In various embodiments of a memory cell of the present disclosure, a conductive layer may include a metal, a doped semiconductor, titanium, titanium nitride (TiN), tantalum nitride (TaN), tungsten (W) or other suitable electrical conductor. The RSL (which can also be referred to in the art as a resistive switching media (RSM)) can comprise, e.g., an undoped amorphous Si layer, a semiconductor layer having intrinsic characteristics, a silicon nitride (e.g. SiN, Si3N4, SiNx where x is a suitable positive number, etc.), a Si sub-oxide (e.g., SiOy wherein y has a value between 0.1 and 2), a Si sub-nitride (e.g., SiNy wherein y has a value between 0.1 and 2), an Al sub-oxide, an Al sub-nitride, and so forth. Other examples of materials suitable for the RSL could include SixGeyOz (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) or other suitable oxides, a metal nitride (e.g., AlN, $AlN_F$ where F is a suitable positive number), a non-stoichiometric silicon compound, and so forth, or a suitable combination thereof. In various embodiments, the RSL includes a number of material voids or defects to trap or hold particles in place, in the absence of an external program stimulus causing the particles to drift within the RSL and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

The contact material layer can be comprised of any suitable conductor, such as a conductive metal, a suitably doped semiconductor, or the like. Where utilized, the contact material layer can be employed to provide good ohmic contact between the RSL and a metal wiring layer of an associated memory architecture. In some embodiments, the contact material layer can be removed and the RSL can be in physical contact with a metal wiring layer. Suitable metal wiring layers can include copper, aluminum, tungsten, platinum, gold, silver, or other suitable metals, suitable metal alloys, or combinations of the foregoing. In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This can cause a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/ grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed within a thermal budget of frontend of line devices.

In some embodiments, the active metal layer can comprise a metal nitride selected from the group consisting of: $TiN_x$, $TaN_x$, $AlN_x$, $CuN_x$, $WN_x$ and $AgN_x$, where x is a positive number. In other embodiments, the active metal layer can comprise a metal oxide selected from the group consisting of: $TiO_x$, $TaO_x$, $AlO_x$, $CuO_x$, $WO_x$ and $AgO_x$. In other embodiments, the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In some embodiments, the switching layer can comprise a material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiNy$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In an embodiment, the active metal layer can comprise a metal nitride: $MN_x$, e.g. $AgN_x$, $TiN_x$, $AlN_x$, and the switching layer can comprise a metal nitride: $MN_y$, e.g. AgNy, TiNy, AlNy, where y and x are positive numbers, and in some cases y is larger than x. In another embodiment, the active metal layer can comprise a metal oxide: $MO_x$, e.g. AgOx, $TiO_x$, $AlO_x$, and the switching layer can comprise a metal oxide: $MO_y$. e.g. AgOy, TiOy, AlOy, where y and x are positive numbers, and in some cases y is larger than x. In still other embodiments, the metal compound of the active metal layer is selected from a first group consisting of: $MN_x$ (e.g., $AgN_x$, $TiN_x$, $AlN_x$), and the switching layer comprises $MO_y$, (e.g. $AgO_x$, $TiO_x$, $AlO_x$) or $SiO_y$, where x and y are typically non-stoichiometric values.

In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

Generally, to program one or more memory cells, a suitable program voltage can be applied across the memory cell(s) causing a conductive filament(s) or path(s) to form through a resistive portion (e.g., interface layer) of the memory cell as mentioned above. This can further cause the memory cell to switch from a relatively high resistive state, to a relatively low resistive state. An erase process can be implemented to reverse, remove, or disassociate the conductive filament(s), at least in part, causing the memory cell to return to the high resistive state from the low resistive state. By convention, herein, the relatively high resistive state is referred to as a "resistive state" or an "off-state" and the relatively low resistive state is referred to as a "conductive state" or an "on-state". This physical change of state, in the context of memory, can be associated with respective logical states of a binary bit (or of multiple bits, in the case of the conductive filament(s) being programmable to four or more distinct resistance states). Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

In some embodiments, the detection circuits disclosed herein can have the following properties:

$I_r = I_d + I_c$;

$I_r = k(V_g - V_1 - V_t h)^2$, where k is a constant based on the architecture of the TTMC and $V_{th}$ represents a threshold voltage of a transistor such as second element 118;

$V_g = \sqrt{I_d/k} + V_1 + V_{th}$.

With regard to resistive two-terminal memory, with an oxide representing an interface or switching layer, the constant, k, can be, e.g., $k=(1/2)*\mu_n*C_{ox}*(W/L)$, where $\mu_n$ relates to an electron mobility metric, $C_{ox}$ relates to an oxide thickness, and W/L represent width and length values.

Example Current Comparison Detection Circuit Embodiments

Figure 5:
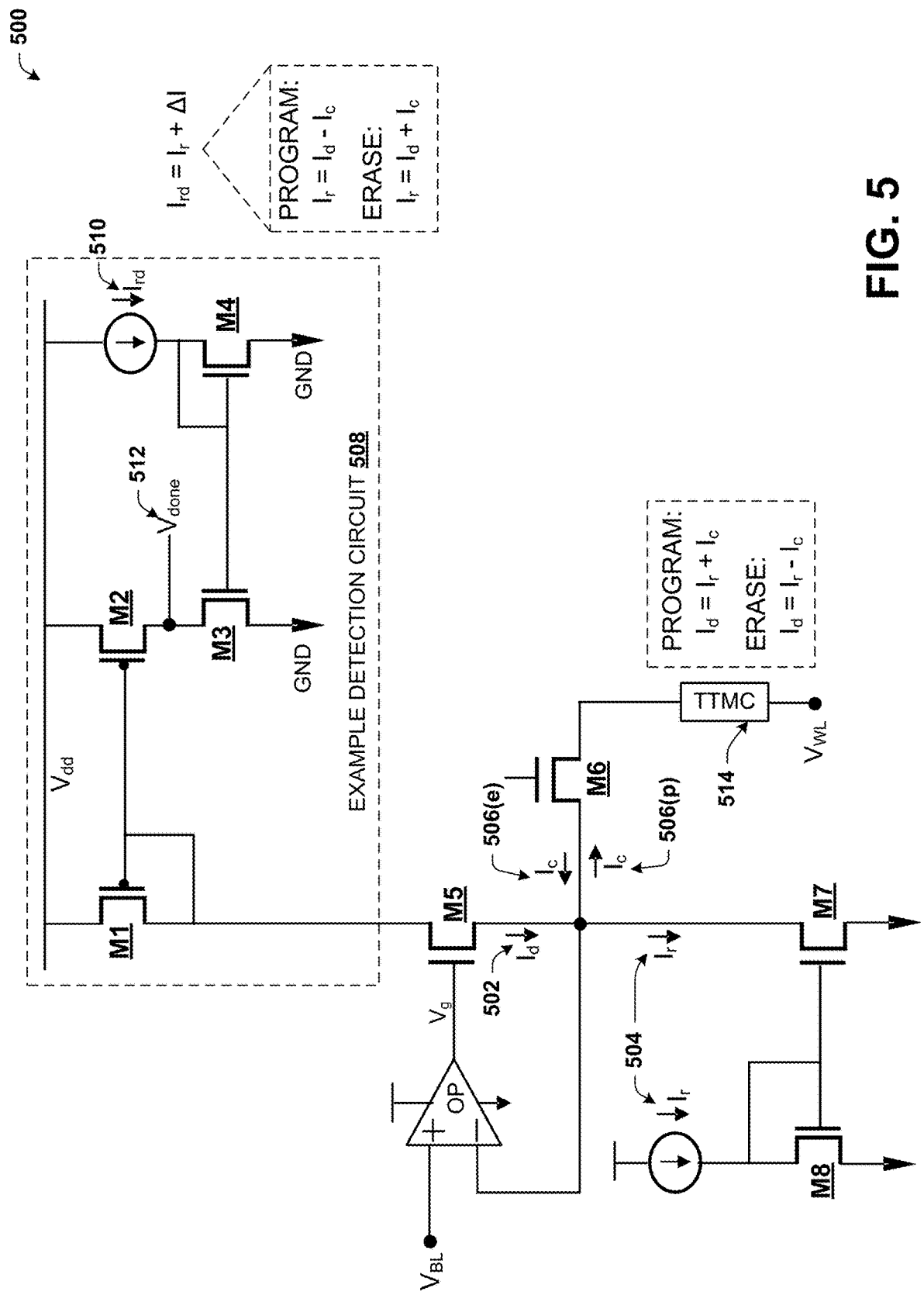
FIG. 5 depicts an example circuit that can detect a state change of a two-terminal memory cell based on current-comparison techniques in accordance with certain embodiments of this disclosure.

Referring now to FIG. 5, an example circuit 500 is depicted. Circuit 500 can detect a state change of a two-terminal memory cell based on current comparison techniques. In some embodiments, circuit 500 can detect the state change during application of the signal/electrical stimulus that operates to produce the state change of the two-terminal memory. For instance, the state change can be detected prior to completion of the electrical stimulus and without application of a subsequent read pulse/stimulus.

Circuit 500 can include example detection circuit 508 that is depicted in the upper portion of FIG. 5 and other portions. The lower portion of FIG. 5 depicts circuitry that in this example is substantially similar to FIG. 2. In this regard, circuit 500 includes TTMC 514, which can be similar to TTMC $206_1$ of FIG. 2 and other circuitry that can be similar to example detection circuit 202 of FIG. 2.

In the present embodiment, eight transistors are depicted, labeled M1-M8, which are used herein as references to better impart the disclosed subject matter. All or a portion of transistors M1-M8 can be substantially similar to one another or can vary based on implementation. For example, in some embodiments transistors M1 and M2 can be P-type metal-oxide-semiconductor (PMOS) transistors and transistors M3 and M4 can be N-type metal-oxide-semiconductor (NMOS) transistors.

The lower portion of FIG. 5 depicts various current parameters that have been detailed supra, and are labeled here as detection current 502 (denoted $I_d$), reference current 504 (denoted $I_r$) and cell current 506 (denoted $I_c$). In some embodiments, for example when TTMC 514 is a bipolar memory cell, the direction of $I_c$ can be changed depending on whether the electrical stimulus to change the state is a program signal or an erase signal. Hence, examples of cell current 506 are depicted for both the case of a program signal (e.g., cell current 506(p)) and an erase signal (e.g., cell current 506(e)). In alternative embodiments, however, it should be understood that TTMC 514 can be oriented in a reverse polarity, such that cell current 506(p) and cell current 506(e) are reversed in their relative orientations (e.g., cell current 506(p) pointing away from transistor M6 and cell current 506(e) pointing toward transistor M6). Suitable modification to example circuit 500 to accommodate such alternatives while performing the same or analogous functions as described herein known to one of ordinary skill in the art, or made known by way of the context provided herein, are considered within the scope of the present disclosure.

As has been discussed, the magnitude (and direction) of $I_r$ can be a fixed value selected based on the implementation. Because a sum of current(s) flowing into a node must equal a sum of current(s) flowing out of a node, and since $I_c$ can change (e.g., as a function of a state of TTMC 514 relative to a target state) and $I_r$ is fixed, $I_d$ can change inversely to $I_c$. It is understood that for state changes in response to an erase signal, $I_d = I_r - I_c$. Likewise, for state changes in response to a program signal, $I_d = I_r + I_c$. Regardless of whether TTMC 514 changes state in response to a program signal or an erase signal, $I_d$ represents the current that flows through the sources and drains of transistors M5 and M1. Since $I_d$ varies based on an inverse relationship with $I_c$, example detection circuit 508 can employ $I_d$ to detect a state change of TTMC 514, which is further detailed with reference to FIG. 6.

Referring back to the upper portions, detection circuit 508 can include a reference current source that can be configured to supply a reference detection current 510, denoted $I_{rd}$. As with $I_r$, $I_{rd}$ can be a fixed value that is configured and/or selected based upon implementation. In some embodiments, $I_{rd}$ can be selected to equal $I_r + \Delta I$, where $\Delta I$ represents a detection threshold function that is further discussed in connection with FIG. 6

Figure 6:
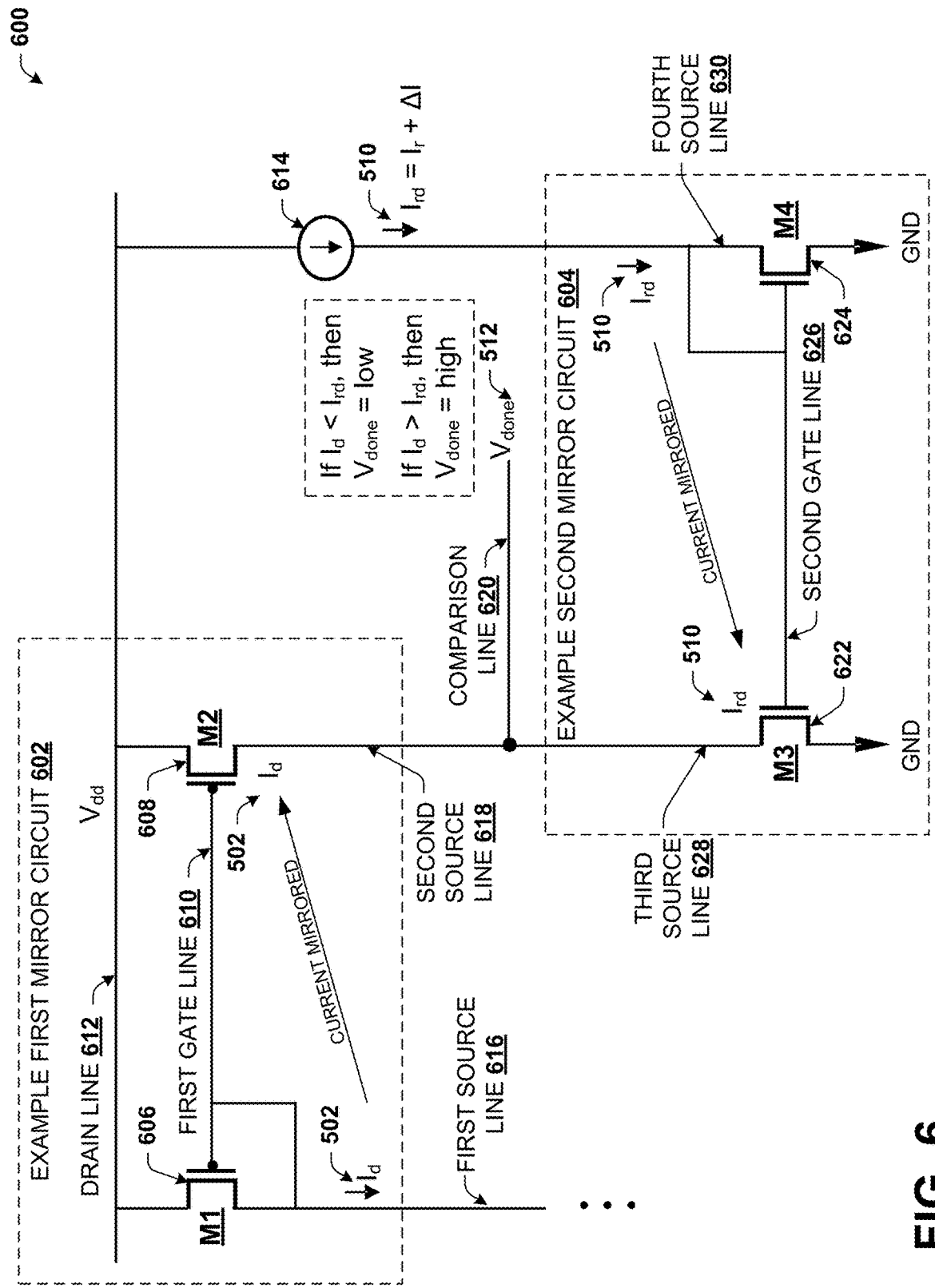
FIG. 6 depicts an example circuit representing a more detailed view of the indicated example detection circuit of FIG. 5 in accordance with certain embodiments of this disclosure.

While still referring to FIG. 5, but turning as well to FIG. 6, circuit 600 is depicted. Circuit 600 represents a more detailed view of the example detection circuit 508. As shown, circuit 600 can include a first mirror circuit 602 (shown at the upper left portion of FIG. 6) and a second mirror circuit 604 (shown at the lower right portion of FIG. 6). Circuit 600 can also include a reference current source 614 configured to supply reference detection current 510 (e.g., $I_{rd}$) and comparison line 620, that can represent an output 512, denoted $V_{done}$.

First mirror circuit 602 can comprise a first transistor 606 (M1), a second transistor 608 (M2) and first gate line 610, which couples a gate of M1 to a gate of M2. First mirror circuit 602 can comprise drain line 612 tied to a drain supply voltage, Vdd as illustrated, and which is coupled to a drain of M1, a drain of M2, and the reference current source 614. First mirror circuit 602 can further comprise a first source line 616 and second source line 618. First source line 616 can be coupled to a source of M1, to first gate line 610, and to a source of M5, which is not depicted here, but shown at FIG. 5. Second source line 618 can be coupled to a source of M2, comparison line 620, and third source line 628.

Second mirror circuit 604 can comprise third transistor 622 (M3) and fourth transistor 624 (M4). Drains for both M3 and M4 can be coupled to ground. Second mirror circuit 604 includes second gate line 626, which couples the gate of M3 to the gate of M4. Second mirror circuit 604 can further comprise the third source line 628 and fourth source line 630. Third source line 628 can be coupled to a source of M3, comparison line 620, and second source line 618. Fourth source line 630 can be coupled to a source of M4, to second gate line 626, and to the reference current source 614.

As depicted, mirror circuits 602 and 604 operate to mirror current through one transistor to another transistor. In this example, $I_d$, flows through the source and drain of M1, so that current, $I_d$, is mirrored to M2. Similarly, $I_{rd}$ is generated by reference detection source 614 and flows through the source and drain of M4. Hence, second mirror circuit 604 mirrors $I_{rd}$ to M3.

Since M2 carries $I_d$ and M3 carries $I_{rd}$, comparison line 620, which is coupled to the sources of both M2 and M3, can be employed to effectively compare the two currents. That is, to compare $I_d$ to $I_{rd}$. For example, If $I_d < I_{rd}$, then $V_{done}$ is effectively pulled to ground at the drain of M3 (e.g., third transistor 622), and will remain low. In typical operation, such will be the case provided TTMC 514 has not changed to the target state. Otherwise, if $I_d > I_{rd}$, then $V_{done}$ is effectively dominated by current at M2 (e.g., second transistor 608), and will go high. In typical operation, such will be the case upon TTMC 514 transitioning from a previous state to the target state. If $I_d = I_{rd}$, then implementation can determine which condition is effectuated.

With the foregoing in mind it can be appreciated that $V_{done}$ going high can represent a signal that TTMC 514 has changed to the target state and such can be the case irrespective of whether the target state results from a program or erase operation. In some embodiments, $V_{done}$ going high can represent a signal that TTMC 514 has been programmed (e.g., changed to the low resistance state), whereas $V_{done}$ going low can represent a signal that TTMC 514 has been erased (e.g., changed to the high resistance state). To provide concrete examples, consider the following two examples.

Erase Example

Suppose TTMC 514 can be set to two distinct states. The first state is a high-resistive state, so an associated $I_c$ will be low, e.g., 2 µA. The second state is a low-resistive state, so an associated $I_c$ in that state will be higher, e.g., 20 µA. By convention used herein, an erase signal is intended to operate to transition TTMC 514 from the low-resistance state (e.g., mapped to a binary "1") to the high-resistance state (e.g., mapped to a binary "0"), but it is understood that the disclosed subject matter can operate regardless of the convention used. Moreover, the disclosed subject matter can be employed in connection with multilevel cells (MLC) in which a single memory cell can retain information associated with multiple bits. For simplicity of explanation, however, it is assumed TTMC 514 is a single level cell (SLC) with two distinct states sufficient to represent one bit of information.

Since, this example is directed to an erase operation to set TTMC 514 to a high resistance state, it is assumed TTMC 5514 is currently in a low resistance state and further that a polarity of $I_c$ will be negative. Hence, for an erase signal that is applied to TTMC 514 in the low resistance state, $I_c$ will be approximately −20 µA, which will increase as TTMC 514 changes state in response to the erase signal. Once $I_c$ reaches −2 µA, (or near that value) TTMC 514 is deemed to be in the target state (e.g., the high resistance state).

Now suppose $I_r$ is set to 30 µA. Because $I_d=I_r-I_c$ when erasing TTMC 514, and further because $I_c$ changes in response to the erase stimulus, $I_d$ is assumed to be within a range of between about 50 µA (e.g., 30−(−20)) to about 30 µA from the time when TTMC 514 changes from the initial state to the target state. Thus, $I_{rd}$ can be selected to be somewhere within that range. For example, $I_{rd}$ can be set to 35 µA, which is between 50 µA and 30 µA.

Now recall $I_{rd}=I_r+\Delta I$, so in this case $\Delta I=5$ µA. Initially, when $I_c$ is −20 µA, then $I_d$ will be 50 µA (since $I_d=I_r-I_c$), which will decrease as $I_c$ increases. During this time, $I_d$ will be greater than $I_{rd}$, so $V_{done}$ will remain high. When $I_c$ reaches −2 µA (e.g., at or near the target state), $I_d$ will approach 32 µA, which is less than the value of $I_{rd}$ that was set in this example at 35 µA. At some point after $I_d$ drops below $I_{rd}$, $V_{done}$ will go low, signaling TTMC 514 is in the target state or, in other words, signaling that TTMC 514 has been successfully erased.

Program Example

In this case, $I_d=I_r+I_c$ (as opposed to the erase case, where $I_d=I_r-I_c$). Suppose TTMC 514 is said to be programmed when $I_c=20$ µA. Further suppose that $I_r$ is set to 10 µA. Thus, $I_d$ is assumed to be within a range of between about 10 µA to about 30 µA from the time when TTMC 514 changes from the initial state to the target state. Hence, $I_{rd}$ can be selected to be somewhere within that range. For example, $I_{rd}$ can be set to 15 µA, which is between 10 µA and 30 µA.

Now recall $I_{rd}=I_r+\Delta I$, so $\Delta I$ is once again equal to 5 µA. Initially, when $I_c=0$, then $I_d$ will be 10 µA (since $I_d=I_r+I_c$), which will increase as $I_c$ increases. During this time, $I_d$ will be less than $I_{rd}$ (e.g., 15 µA) so $V_{done}$ will remain low. When $I_c$ reaches 20 µA (e.g., at or near the target state), $I_d$ will approach 30 µA, which is greater than the value of $I_{rd}$ that was set in this example at 15 µA. At some point after $I_d$ increase above $I_{rd}$, $V_{done}$ will go high, signaling TTMC 514 is in the target state or, in other words, signaling that TTMC 514 has been successfully programmed.

While the two examples above represent some possible embodiments, it is appreciated that other embodiments can exist. Furthermore, it is appreciated that various values (e.g., $I_d$, $I_{rd}$, I, etc.), reference or otherwise, can be selected or set to be operable with, and to determine a state change for, any suitable two-terminal memory device, regardless of the particular parameters. Moreover, it is understood those values can be selected with greater or less precision than the examples provided above. For example, values can be selected to detect state changes when $I_{rd}$ and $I_d$ are the same or differ by less than about one microampere.

Example Methods for Detecting a State Change of a Two-Terminal Memory Cell

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 7:
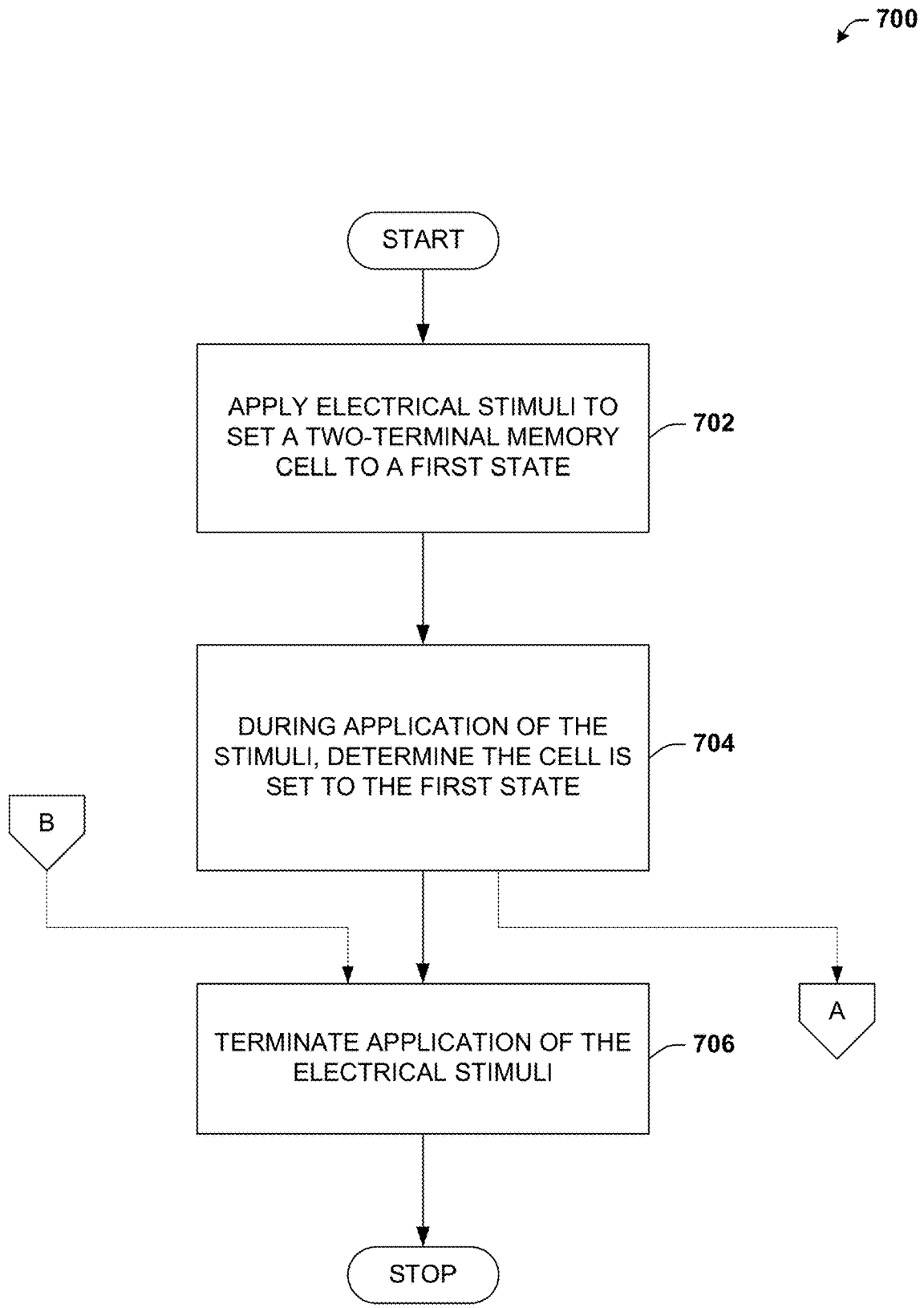
FIG. 7 illustrates an example methodology that can provide for detecting a state change during application of electrical stimuli that cause the state change in accordance with certain embodiments of this disclosure.
Figure 8:
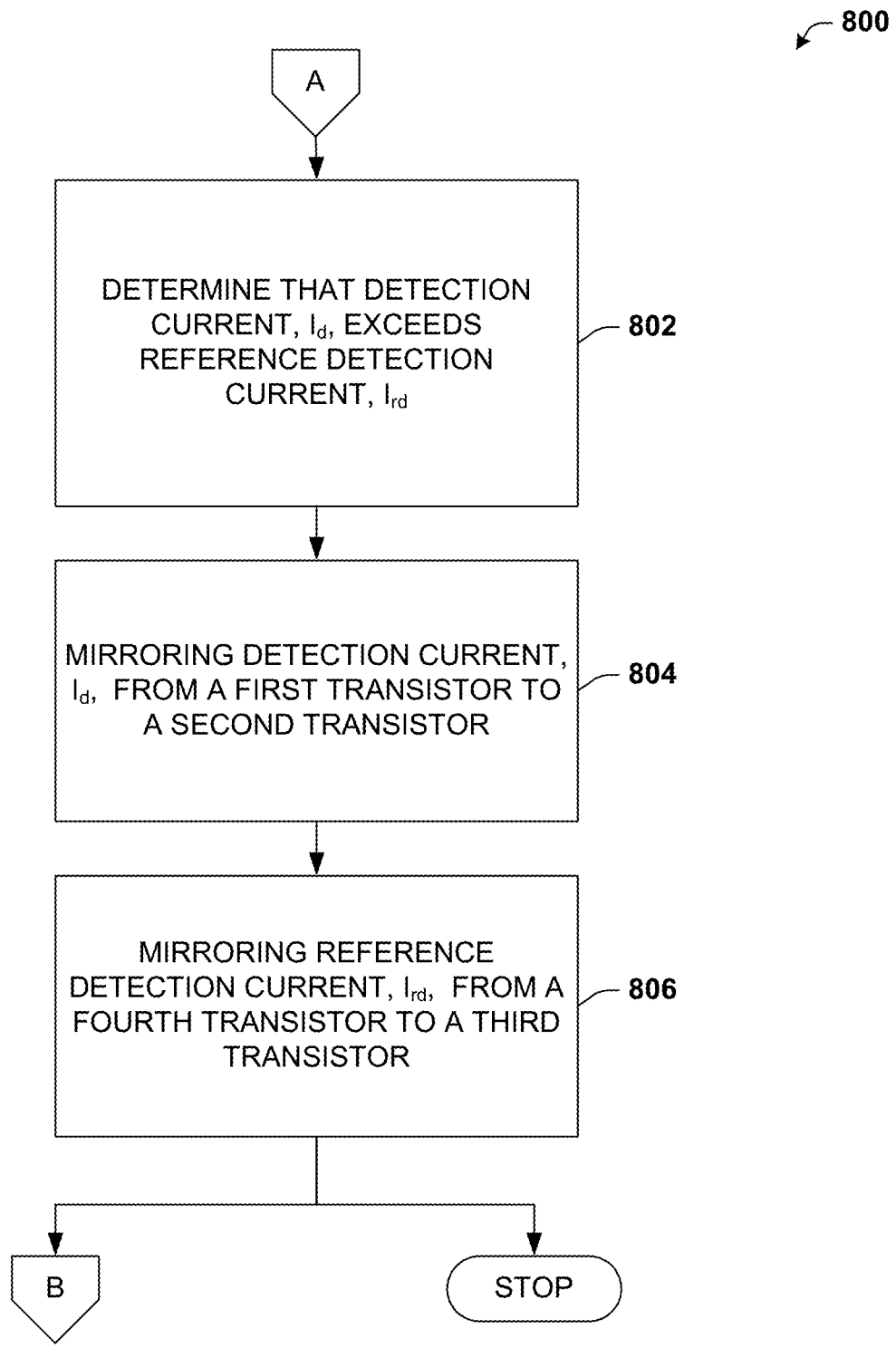
FIG. 8 illustrates an example methodology that can provide additional aspects or elements in connection with detecting a state change of a TTMC during application of the electrical stimuli in accordance with certain embodiments of this disclosure.

In view of the exemplary diagrams described supra, process methods that can be implemented in accordance with the disclosed subject matter will be better appreciated with reference to the flow charts of FIGS. 7-8. While for purposes of simplicity of explanation, the methods of FIGS. 7-8 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 7, exemplary method 700 is illustrated. Method 700 can provide for detecting a state change during application of electrical stimuli that cause the state change. It is understood that other techniques for detecting and/or verifying a state change, e.g., ISP, rely on a subsequent read pulse that is applied after the state-changing stimuli has completed. If the target state change is not subsequently read and verified, further iterations of the state-changing stimuli and subsequent read pulses are applied.

At reference numeral 702, a controller of a memory device can apply electrical stimuli to a wordline and a bitline. In some embodiments, the controller can transmit instruction(s) (e.g., to a voltage generator device) to apply the electrical stimuli. The wordline can be coupled to a first terminal of a TTMC and the bitline can be coupled to a second terminal of the TTMC. The electrical stimuli can be configured to set the TTMC to a first state representing a binary value. For example, a voltage bias of about 2.0 V to about 3.0 V can be applied to the wordline and a voltage bias of about 0.5 V can be applied to the bitline, which can be determined to be sufficient to set the TTMC to a highest resistance state (e.g., the first state).

At reference numeral 704, the controller can determine that the TTMC is set to the first state. It is understood that the determination that the TTMC is set to the first state can occur during application of the electrical stimuli. Said differently, the electrical stimuli do not need to complete a predefined cycle before the determination is made. Method 700 can branch to insert A, which provides additional detail relating to the determination that the TTMC is set to the first state and is further discussed with reference to FIG. 8. Additionally or alternatively, Method 700 can proceed to reference numeral 706.

At reference numeral 706, the controller can terminate or transmit an instruction(s) to terminate application of the electrical stimuli. Generally, termination of the electrical stimuli can be facilitated in response to the determining the TTMC is set to the first state. Method 700 ends.

Turning now to FIG. 8, exemplary method 800 is illustrated. Method 800 can provide additional aspects or elements in connection with detecting a state change of a TTMC during application of the electrical stimuli. For example, at reference numeral 802, the determining the cell is set to the first state (detailed at reference numeral 704 of FIG. 7) can comprise determining that a detection current, $I_d$, exceeds a reference detection current, $I_{rd}$. $I_{rd}$ can be generated by a reference detection current source of a detection circuit of the memory device and $I_d$ can be a function of a cell current, $I_c$, representing a current through the TTMC during application of the electrical stimuli.

At reference numeral 804, the determining the cell is set to the first state can comprise mirroring $I_d$ from a first transistor of the detection circuit to a second transistor of the detection circuit. At reference numeral 806, the determining the cell is set to the first state can comprise mirroring $I_{rd}$ from a fourth transistor of the detection circuit to a third transistor of the detection circuit.

Example Operating Environments

Figure 9:
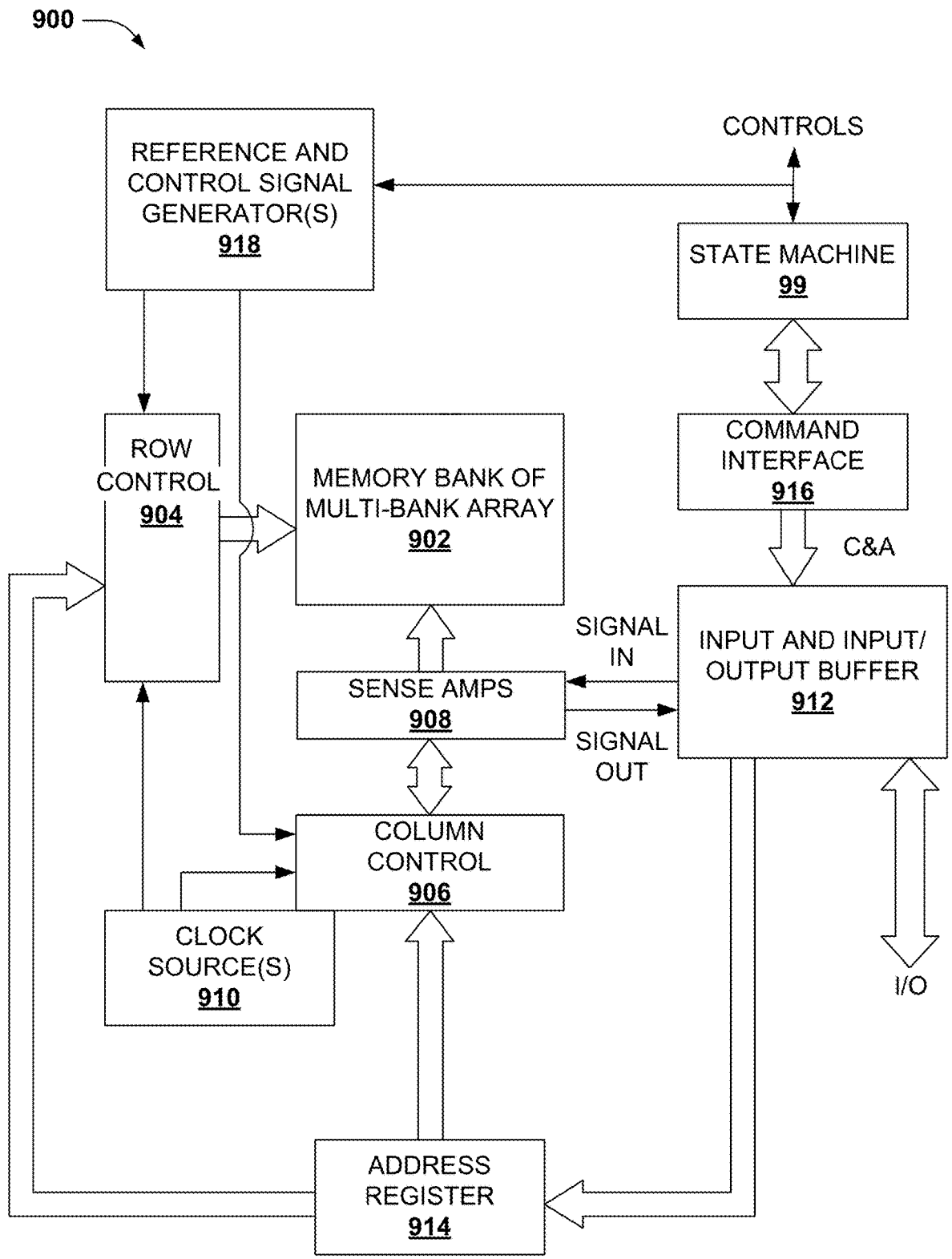
FIG. 9 illustrates a block diagram of an example electronic operating environment in accordance with certain embodiments of this disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 9 illustrates a block diagram of an example operating and control environment 900 for a memory cell array 902 according to aspects of the subject disclosure. In at least one aspect of the subject disclosure, memory cell array 902 can comprise a variety of memory cell technology. Particularly, memory cell array 902 can comprise two-terminal memory such as high density, selector-based resistive memory cells with a low-profile gate (e.g., a gate consuming a relatively small substrate surface area compared with conventional transistor gate devices), as described herein.

A column controller 906 can be formed adjacent to memory cell array 902. Moreover, column controller 906 can be electrically coupled with bit lines of memory cell array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory cell array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 914. In addition, input data is transmitted to memory cell array 902 via signal input lines, and output data is received from memory cell array 902 via signal output lines. Input data can be received from the host apparatus, and output data can be delivered to the host apparatus via the I/O buffer.

Commands received from the host apparatus can be provided to a command interface 916. Command interface 916 can be configured to receive external control signals from the host apparatus, and determine whether data input to the input/output buffer 912 is write data, a command, or an address. Input commands can be transferred to a state machine 920.

State machine 920 can be configured to manage programming and reprogramming of memory cell array 902. State machine 920 receives commands from the host apparatus via input/output interface 912 and command interface 916, and manages read, write, erase, data input, data output, and like functionality associated with memory cell array 902. In some aspects, state machine 920 can send and receive acknowledgments and negative acknowledgments regarding successful receipt or execution of various commands.

In an embodiment, state machine 920 can control an analog voltage waveform generator 918 that provides read/write and program/erase signals to row control 904 and column control 906.

To implement read, write, erase, input, output, etc., functionality, state machine 920 can control clock source(s) 910. Control of clock source(s) 910 can cause output pulses configured to facilitate row controller 904 and column controller 906 implementing the particular functionality. Output pulses can be transferred to selected bit lines by column controller 906, for instance, or word lines by row controller 904, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
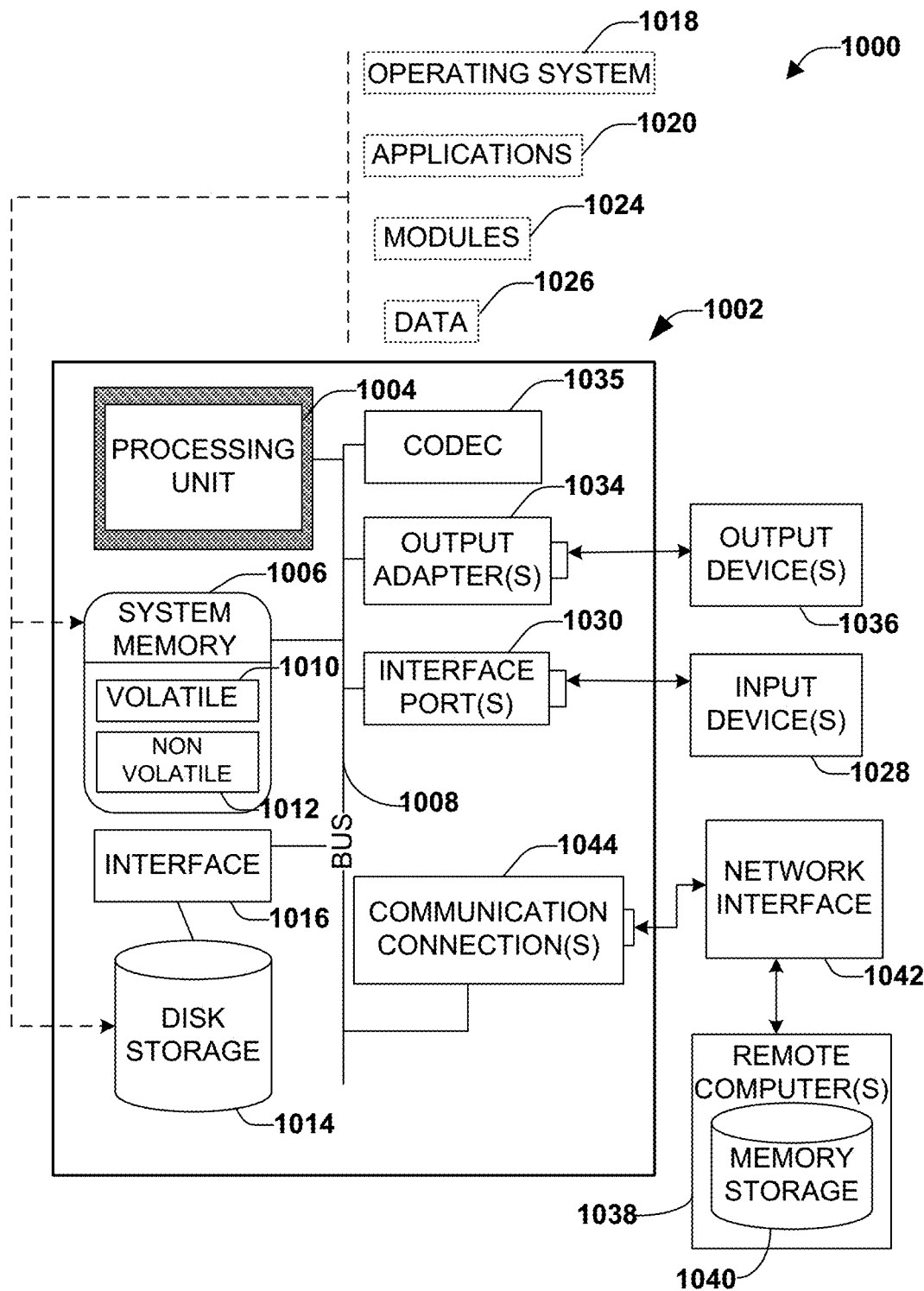
FIG. 10 illustrates a block diagram of an example computing environment in accordance with certain embodiments of this disclosure.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1094), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
a plurality of two-terminal memory cells, each coupled to a wordline, wherein a cell of the plurality of two-terminal memory cells comprises a first terminal coupled to the wordline and a second terminal coupled to a bitline; and
a detection circuit that, during application of an electrical stimulus configured to cause a change in state to the cell from a first defined state representing a first binary value to a second defined state representing a second binary value, detects the cell transitioning from the first defined state to the second defined state concurrent with the application of the electrical stimulus, wherein the detection circuit in part comprises:
a shared node electrically coupled to:
a cell current line that is connected to the bitline or to the wordline of the cell of the plurality of two-terminal memory cells, wherein a cell current $I_c$ flowing through the cell is configured also to flow to the shared node by way of the cell current line,
a reference line having a reference current $I_r$ generated by a reference current source that flows to the shared node from the reference line, and
a detect line that provides a detection current $I_d$ that flows to the shared node from a reference voltage on the detect line, and
a measurement node that has a first value that changes in response to a change in a second value of $I_d$ corresponding to the cell transitioning from the first defined state to the second defined state.

2. The memory device of claim 1, wherein the detection circuit facilitates termination of the electrical stimulus in response to determining the cell has transitioned to the second defined state.

3. The memory device of claim 2, wherein the detection circuit determines the cell has transitioned to the second defined state in response to a comparison of a gate voltage, $V_g$ on a gate line of the detection circuit, the gate line being coupled to an output node of a first circuit element of the detection circuit and coupled to a gate node of a second circuit element of the detection circuit, wherein the measurement node is provided at the gate line and outputs a voltage value of $V_g$ for the first value that changes in response to the change in the second value of $I_d$.

4. The memory device of claim 1, wherein the detection circuit comprises:
a first current mirror circuit that mirrors the detection current, $I_d$, that is a function of the cell current, $I_c$, at the cell in response to the electrical stimulus;
a reference current source configured to supply a reference detection current, $I_{rd}$, that is selected as a function of when the cell is in the second defined state; and
a second current mirror circuit that mirrors $I_{rd}$,
wherein the measurement node is positioned at a junction of the first current mirror and the second current mirror,
wherein the detection circuit determines the cell has transitioned to the second defined state in response to a determination at the measurement node that a magnitude of $I_d$ is greater than a magnitude of $I_{rd}$, and
wherein $I_d$ is a function of $I_c$ and the reference current, $I_r$, that is configured to have a magnitude greater than a maximum $I_c$ characterized as $I_c$ when the two-terminal memory device is in a lowest resistance state.

5. The memory device of claim 4, wherein $I_d$ increases and becomes greater than $I_{rd}$ in response to a state change for the two-terminal memory device, and the state change is characterized by the two-terminal memory transitioning from a first defined state to a second defined state that is a higher-resistance state than the first defined state or a lower-resistance state than the first defined state.

6. The memory device of claim 4, wherein first current mirror circuit comprises a first transistor and a second transistor, and the first transistor and the second transistor are P-type metal-oxide-semiconductor (PMOS) transistors.

7. The memory device of claim 4, wherein the electrical stimulus is an erase pulse configured to set the two-terminal memory device to a higher resistive state and $I_d$ is substantially equal to $I_r-I_c$.

8. The memory device of claim 4, wherein the electrical stimulus is a program pulse configured to set the two-terminal memory device to a lower resistive state and $I_d$ is substantially equal to $I_r+I_c$.

9. A method, comprising:
transmitting, by a controller of a memory device, an instruction to apply electrical stimuli to a wordline that is coupled to a first terminal of a two-terminal memory cell of the memory device and a bitline that is coupled to a second terminal of the two-terminal memory cell, wherein the electrical stimuli are configured to set the two-terminal memory cell to a first state of a binary value;
during application of the electrical stimuli, measuring, by a detection circuit of the memory device that comprises no more than three current mirror circuits, an electrical response of the two-terminal memory cell to the electrical stimuli and determining that the two-terminal memory cell is set to the first state;
transmitting, by the controller, a second instruction to apply a second electrical stimuli to the wordline and to the bitline, wherein the second electrical stimuli are configured to reset the two-terminal memory cell to a second state of the binary value;
during application of the second electrical stimuli, measuring by the detection circuit a second electrical response of the two-terminal memory cell to the second electrical stimuli and determining that the two-terminal memory cell is reset to the second state; and
in response to the determining the two-terminal memory cell is set to the first state, terminating application of the electrical stimuli.

10. The method of claim 9, wherein the determining the cell is set to the first state comprises determining that a detection current, $I_d$, that is a function of a cell current, $I_c$, representing a current through the two-terminal memory cell during application of the electrical stimuli exceeds a reference detection current, $I_{rd}$, generated by a reference detection current source of the detection circuit of the memory device.

11. The method of claim 10, wherein the determining the cell is set to the first state comprises:
mirroring $I_d$ from a first transistor of a first current mirror circuit of the detection circuit to a second transistor of the first current mirror circuit of the detection circuit; and
mirroring $I_{rd}$ from a fourth transistor of a second current mirror circuit of the detection circuit to a third transistor of the second current mirror circuit of the detection circuit.

12. The method of claim 10, wherein the determining the cell is set to the first state comprises determining a gate voltage, $V_g$, representative of a voltage at a gate of a transistor of the detection circuit and at an output of an operational amplifier of the detection circuit, has a magnitude that differs from a reference magnitude of a reference voltage, $V_{config}$.

13. The method of claim 9, further comprising: terminating application of the second electrical stimulus in response to determining the two-terminal memory cell is reset to the second state.

14. The method of claim 9, further comprising: measuring a value of a gate voltage, $V_g$ that is a voltage at a gate of a transistor of the detection circuit and at an output of an operational amplifier of the detection circuit and determining the cell has transitioned to the second state in response to a change in the value of $V_g$ that is indicative of the second state.

15. The method of claim 9, further comprising:
determining the cell has transitioned to the second state in response to a determination that a magnitude of a detection current, $I_d$ is greater than a magnitude of a reference detection current, $I_{rd}$, and
wherein $I_d$ is a function of a cell current, representing a current through the two-terminal memory cell, and a reference current, $I_r$, configured to have a magnitude greater than a maximum $I_c$ characterized as $I_c$ when the two-terminal memory device is in a lowest resistance state.

16. A memory device, comprising:
a plurality of two-terminal memory cells, each coupled to a wordline, wherein a cell of the plurality of two-terminal memory cells comprises a first terminal coupled to the wordline and a second terminal coupled to a bitline; and
a detection circuit comprising a reference current source, a first current mirror circuit and a second current mirror circuit that, during application of an electrical stimulus configured to cause a change in state to the cell from a first defined state representing a first binary value to a second defined state representing a second binary value, detects the cell transitioning from the first defined state to the second defined state concurrent with the application of the electrical stimulus, wherein
the first current mirror circuit comprises:
a first transistor that shares a common node, by way of an access transistor, with the memory device;
a first gate line that is coupled to a first gate of the first transistor and a second gate of a second transistor;
a drain supply line that is coupled to a first drain of the first transistor, to a second drain of the second transistor, and to the reference current source;
a first source line that is coupled to a first source of the first transistor, coupled to the first gate line and to the first gate and the second gate by way of the first gate line, and coupled to the common node by way of the access transistor; and
a second source line that is coupled to a second source of the second transistor, to a comparison line, and to a third source line of a third transistor that is coupled to the comparison line, wherein the first transistor and the second transistor are part of the first current mirror, and the third transistor is part of the second current mirror.

17. The detection circuit of claim 16, wherein the first source line is configured to facilitate conductance of a detection current, $I_d$, that is a function of a cell current, $I_c$, that represents a current through the two-terminal memory device in response to an electrical stimulus.

18. The detection circuit of claim 17, wherein $I_d$ is a function of $I_c$ and a reference current, $I_r$, wherein $I_r$ is generated by a second reference current source of a reference current circuit and wherein $I_r$ is configured to have a magnitude greater than a maximum $I_c$ characterized as a magnitude of $I_c$ in response to the electrical stimulus and to the two-terminal memory device being in a lowest resistance state.

19. The detection circuit of claim 18, wherein the electrical stimulus is an erase pulse configured to set the two-terminal memory device to a higher resistive state and $I_d$ is substantially equal to $I_r - I_c$.

20. The detection circuit of claim 18, wherein the electrical stimulus is a program pulse configured to set the two-terminal memory device to a lower resistive state and $I_d$ is substantially equal to $I_r + I_c$.

* * * * *